United States Patent [19]

Kobayashi

[11] Patent Number: 5,144,615
[45] Date of Patent: Sep. 1, 1992

[54] APPARATUS AND METHOD FOR RECORDING AND REPRODUCING MULTI-LEVEL INFORMATION

[75] Inventor: Tadashi Kobayashi, Chiba, Japan

[73] Assignee: Kabushiki Kaisha Toshiba, Kawasaki, Japan

[21] Appl. No.: 455,633

[22] Filed: Dec. 22, 1989

[30] Foreign Application Priority Data

Dec. 27, 1988 [JP] Japan .................................. 63-327578

[51] Int. Cl.⁵ .............................................. G11B 7/00
[52] U.S. Cl. ..................................... 369/116; 346/76 L
[58] Field of Search ......................... 346/766, 135.1; 365/106, 119; 369/109, 100, 116

[56] References Cited

U.S. PATENT DOCUMENTS 4,825,408 4/1989 Potember .......................... 365/113

Primary Examiner—Robert L. Richardson
Attorney, Agent, or Firm—Foley & Lardner

[57] ABSTRACT

An information recording apparatus includes a record signal analog processor which converts information to be recorded into an analog signal having a plurality of levels, a laser beam source for emitting a laser beam whose energy and radiating time are modulated at multiple levels in accordance with the analog signal, and an optical system for directing the laser beam on an information recording medium. The information recording medium has a recording layer. As a result of the modulation of the laser energy, a plurality of states of recording marks are obtained. As a result of the modulation of the laser radiating time, a plurality of lengths of recording marks are obtained in the radiated portion. Thus, multi-level information is recorded in the data recording medium. The recorded information can be reproduced by detecting the optical characteristics of these recording marks.

12 Claims, 4 Drawing Sheets

APPARATUS AND METHOD FOR RECORDING AND REPRODUCING MULTI-LEVEL INFORMATION

BACKGROUND OF THE INVENTION

1. Field of the Invention

The present invention relates to an information recording apparatus and method capable of radiating a light beam onto an information recording medium to record multi-level data in a portion of the recording medium.

2. Description of the Related Art.

In order to increase the capacity and processing speed of computers in the future, an increase in the density and capability of memories is an important technical object. In currently available optical memories, such as optical disks and cards, only a one-level signal (i.e., a signal corresponding to the presence or absence of a data bit record) can be written in a single record spot. Mark-position recording and mark-edge recording are currently utilized to record information onto such optical memories. In mark-position recording, the center of the recording mark is positioned at the location of a data bit, whereas in mark-edge recording, the edge of recording mark is positioned at the location of a data bit. Generally, recording density is much higher in mark-edge recording than in mark-position recording. In both recording methods, however, only a one-level signal (i.e., a signal corresponding to the presence or absence of a data bit) can be written in a single record spot. Thus, if mark-edge recording is utilized, the recording density achieved is not sufficiently high. In order to overcome this limited memory density, a multi-value signal recording system for writing a multi-value signal in a single record spot is necessary. An ultra-high density optical memory using a photochemical hole burning (PHB) technique is an example of a memory employing such a multi-value recording system. See, for example, U.Itoh et al. Page 147 through 150 in Topical Meeting on Optical Data Storage, Mar. 11-13, 1987, Stateline, Nev. The PHB material has a host made of transparent materials and guest material dispersed in the host. Only the guest material absorbs light and a photochemical reaction occurs in the guest at a temperature as low as several degrees to several tens of degrees K. When a light beam having wavelength is radiated onto PHB material, the guest material absorbs the light beam so as to generate a hole of an absorption spectrum at wavelength $\lambda$. By modulating wavelengths of light into n-levels and directing the light onto the guest material of PHB material, the guest material has n different absorption spectra, and n-value data can be recorded. When the recorded data is reproduced, the reflectivity or transmissivity of the recording medium is detected at the n-level wavelength. In such an n-value recording system using PHB, however, the PHB memory film must be kept at a very low temperature. Many problems concomitant with its use as an optical memory device remain unsolved. Hence, to date no practical applications of a high-density optical recording system have been realized.

SUMMARY OF THE INVENTION

The present invention solves the above-described problems, and has as its object to provide an information recording apparatus and method capable of realizing practical high-density recording.

According to the present invention, there is provided an information recording apparatus. The apparatus comprises signal processing means for converting an information signal to be recorded into a signal of not less than three levels. Light beam output means are provided for outputting a light beam whose energy and radiating time is modulated at multiple levels in accordance with the processed signal. Optical means direct the light beam onto the information recording medium, wherein the multi-level information is recorded in the information recording medium by changing a portion of the information recording medium in at least one of a plurality of states.

According to the present invention, there is provided an information recording method utilizing a mark-edge recording process comprising the steps of converting information to be recorded into a signal having not less than three levels. A light beam whose energy and radiating time are modulated at multiple levels in accordance with the signal is radiated onto a recording medium, wherein the multi-level signal is recorded onto the medium by changing of a portion of the medium in at least one of a plurality of states, and, preferably, not less than three states, thereby recording the multi-level information in the recording medium.

BRIEF DESCRIPTION OF THE DRAWINGS

A more complete appreciation of the present invention and many of the attendant advantages thereof will be more readily obtained through reference to the following detailed description and accompanying drawings, in which.

DETAILED DESCRIPTION OF THE PREFERRED EMBODIMENT

Figure 1:
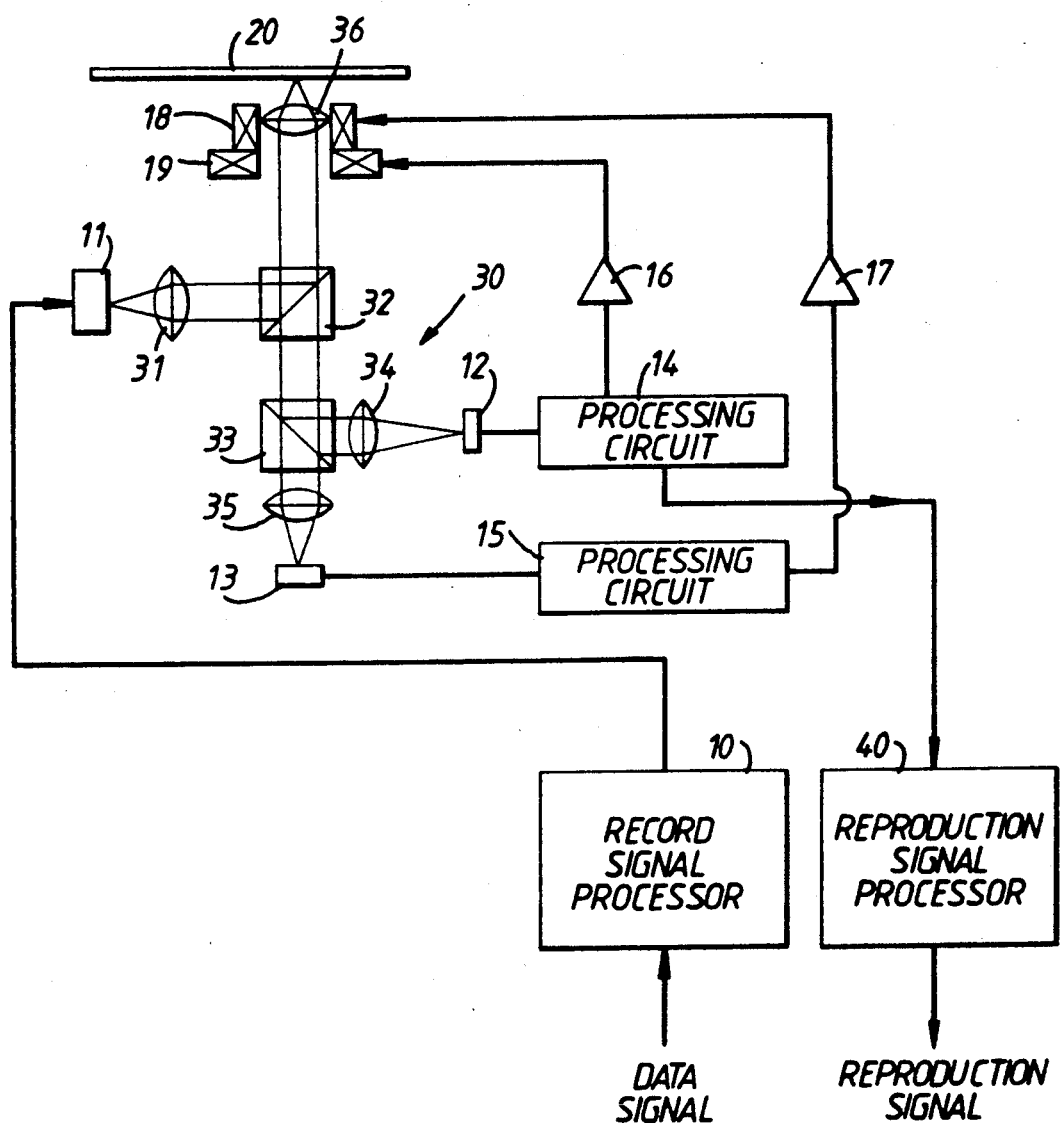
FIG. 1 is a schematic view of an information recording apparatus according to an embodiment of the present invention.

An embodiment of the present invention will be described in detail with reference to the accompanying drawings. FIG. 1 is a schmatic view showing an arrangement of an information recording apparatus in accordance with the present invention.

A record signal processor 10 converts an input data signal into a signal having not less than three levels which is then outputted to a semiconductor laser 11. The laser 11 radiates a recording laser beam in response to the signal from the signal processor 10 having not less than three energy levels. When a laser beam having such multi-level optical characteristics is directed onto a recording medium (to be described later) of an optical disk 20 through an optical system 30, the state of a radiated portion of the optical disk 20 is changed in accordance with the energy of the laser beam to thereby record multi-level data. For example, the transmissivity or reflectivity of the optical disk 20 can be changed to a number of descrete levels of transmissivity or reflectivity, respectively. Each of these discrete levels corresponds to a level of information stored on the optical disk 20. Preferably, the number of discrete levels of transmissivity or reflectivity is not less than three. In this way, not less than three bits of information can be stored at one record spot and not less than three data bits can be read from the record spot.

When data is to be reproduced from the optical disk 20, the semiconductor laser 11 outputs a constant laser beam having an intensity lower than that of a recording laser beam. The reproducing laser beam output from the laser 11 is directed to the optical disk 20 through the optical system 30 and a reflected beam is incident on an opto-electric conversion element 12 through the optical system 30. A signal converted by the opto-electric conversion element 12 is supplied to a reproduction signal processor 40 through a processing circuit 14. As a result, reproduction signals corresponding to multi-level data are output, as will be described later. It can be understood that where the transmissivity of the optical disk 20 is to be detected, an optical system, opto-electric conversion element, and processing circuit can be disposed on the side of optical disk 20 opposite from lens 36. These elements may correspond in structure and function to optical system 30, opto-electric conversion element 12, and processing circuit 14 described above and shown in FIG. 1.

In the optical system 30, a divergent laser beam output from the semiconductor laser 11 is collimated by a collimator lens 31, and is incident on a beam splitter 32. A beam reflected by the beam splitter 32 is incident to the optical disk 20 through a focusing lens 36. When a reproducing laser beam is output from the laser 11, the laser beam is reflected by the optical disk 20 and passes through the beam splitter 32 is incident to a half mirror 33. The beam passing through the half mirror 33 is directed to the opto-electric conversion element 13 through a lens 35, and the beam reflected by the half mirror 33 is directed to the photoelectoric conversion element 12 through a lens 34.

As described above, the signal output from the opto-electric conversion element 12 is output to the reproduction signal processor 40 through processing circuit 14. Another signal from processing circuit 14 is guided to a tracking controller 19 through an amplifier 16 so as to adjust the position of the beam. In addition, the signal output from opto-electric conversion element 13 is supplied to a focusing controller 18 through a processing circuit 15 and an amplifier 17, thereby performing focusing control.

Figure 2:
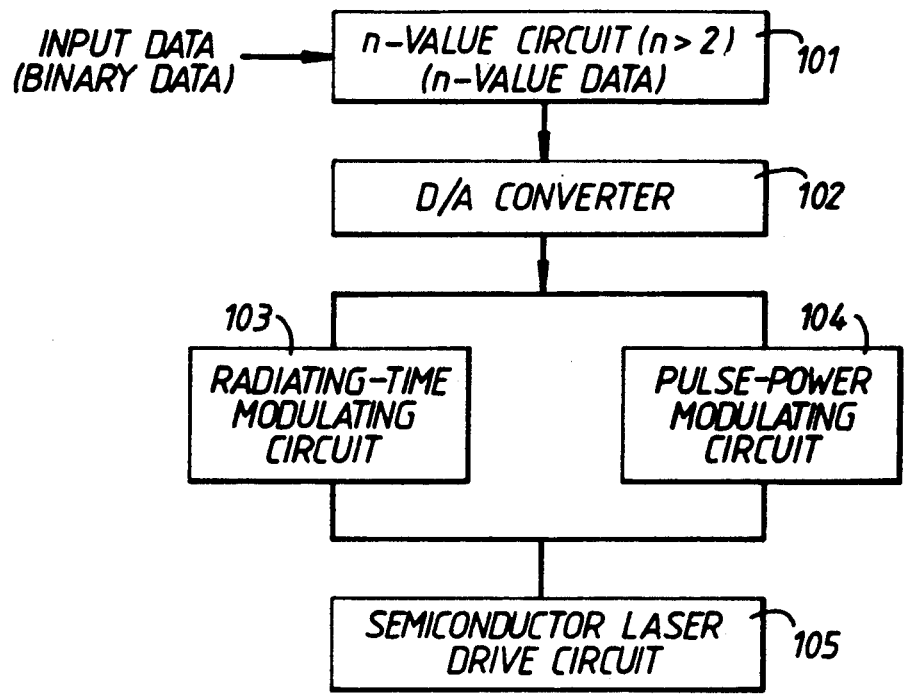
FIG. 2 is a block diagram of the record signal processor in the apparatus shown in FIG. 1.

The record signal processor 10 will be described in detail below. FIG. 2 is a block diagram showing a schmatic arrangement of record signal processor 10 comprising an n-value circuit 101, a D/A converter 102, a radiating-time modulating circuit 103, a pulse-power modulating circuit 104 and a semiconductor laser driver 105. Input data is input into n-value circuit 101 in binary form. The data input into n-value circuit 101 corresponds to the degree of multiplexing of the data to be stored on optical disk 20. The n-value data is then converted into an analog signal by the D/A converter 102 and is input into the semiconductor laser driver 105 after its radiating-time and power are modulated in accordance with the processed signal by a radiating-time modulating circuit 103 and a pulse-power modulating circuit 104.

The recorded information is reproduced by radiating a continuous and low-energy laser beam onto a recording portion and detecting changes in reflectivity of the laser beam reflected by the recording layer.

Figure 3:
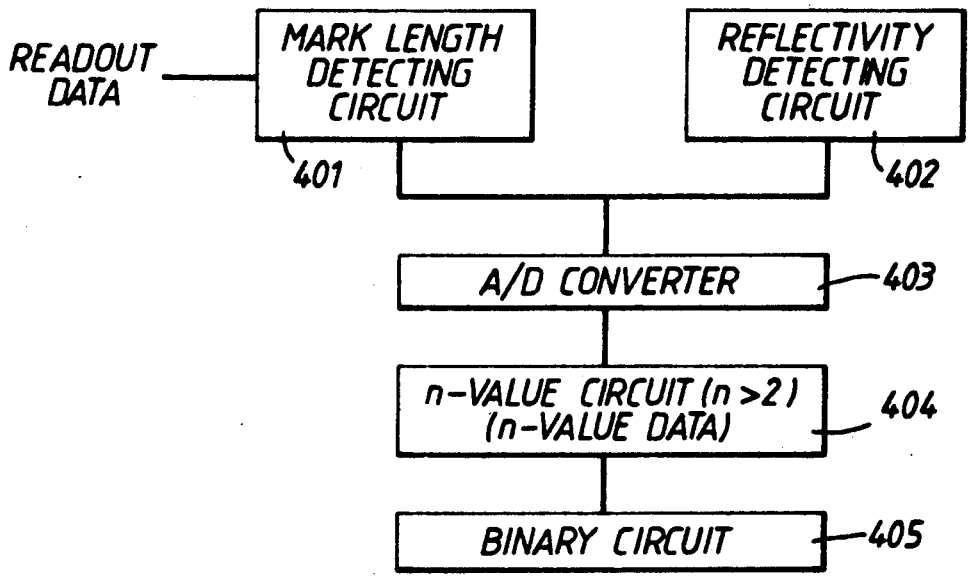
FIG. 3 is a block diagram of the reproduction signal processor in the apparatus shown in FIG. 1.

FIG. 3 is a block diagram showing a schematic arrangement of the reproduction signal processor. As shown in FIG. 3, processor 40 comprises a mark length detecting circuit 401, a reflectivity detecting circuit 402, and A/D converter 403, an n-value circuit 404, and a binary circuit 405. Reflectivity is detected by recording layer circuit 401 and mark length is detected by mark length detecting circuit 402. The detected analog value is digitized by A/D converter 403. The digitized signal is then converted into an n-value signal by n-value circuit 404 by comparing it with a predetermined reference voltage. Subsequently, the n-value signal is converted into an binary signal by binary circuit 405.

Figure 4:
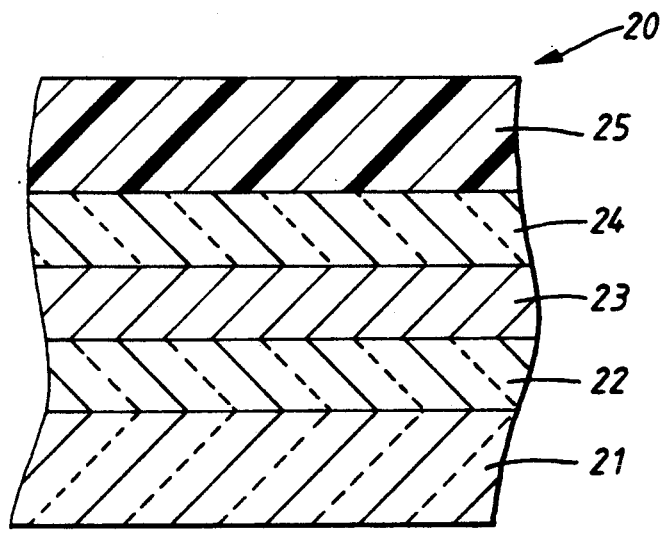
FIG. 4 is a sectional view of an information recording medium in which information may be recorded by the apparatus shown in FIG. 1.

The information recording medium 20 will now be described in detail below. FIG. 4 is a sectional view of phase-transformation type information recording medium for use with the present invention. A substrate 21 is a transparent material whose quality does not change significantly over time, e.g., an acrylic resin such as polymethylmethacrylate, a polycarbonate resin, an epoxy resin, a styrene resin, or a glass material. A protective layer 22, a recording layer 23, a protective layer 24, and a surface protective layer 25 are formed on the substrate 21 in the order named.

Recording layer 23 is formed of a material whose state is changed upon radiation of a laser beam of a certain power on it. A phase transformation type material may be used as one example such a material. In a recording layer of the transformation type, phase transformation occurs between, e.g., a crystalline phase and an amorphous phase depending on the radiating conditions of the laser beam. In this case, when the radiation energy of a laser beam is modulated between one or more levels, one or more intermediate phases with differences in optical characteristics such as reflectivity and transmittance are formed in the recording medium. Thus, multi-value data can be recorded and reproduced by utilizing this phase transformation.

Examples of phase transformation type materials include chalcogenide amorphous semiconductor materials, e.g., GeTe, TeSe, GeSbSe, TeOx, InSe, and InSbTe. Recording layer 23 can be formed by vacuum evaporation, sputtering, or the like. The thickness of recording layer 23 preferably falls within the range from several nm to several $\mu$m in terms of practical applications. Protective layers 22 and 24 are arranged to sandwich recording layer 23, thus preventing disintegration of recording layer 23 while permitting formation of holes therein upon radiation of a laser beam. Protective layers 22 and 24 can be made of $SiO_2$, SiO, AlN, $Al_2O_3$, $ZrO_2$, ZrO, $TiO_2$, $Ta_2O_3$, ZnS, Si, or Ge formed by vacuum evaporation or sputtering. The thickness of each of protective layers 22 and 24 preferably falls within the range from several nm to several um in terms of practical applications. Protective layer 25 is formed to prevent damage, dust contamination, and the like during use, and normally is made of an ultraviolet-curing resin or the like. Protective layer 25 can preferably be formed by coating, e.g., an ultraviolet-curing resin on protective layer 24. Protective layer 25 preferably falls within the range from several nm to several hundreds of μm in thickness.

The above description illustrates a one-sided information recording medium. However, the present invention can be used with a two-sided data recording medium, as would be formed by bonding two one-side information recording media to each other with a recording layer 23 located inside each.

Data recording can be performed by radiating a laser beam from semiconductor laser 11 onto the recording layer of the recording medium through optical system 30 to form a recording mark. In this case, a binary data signal is converted into n-value data(n>2) by n-value circuit 101 of record signal processor 10. The energy of the laser beam output from laser 11 is modulated at n levels and the radiation time of the laser beam is modulated in accordance with the signal.

Figure 5:
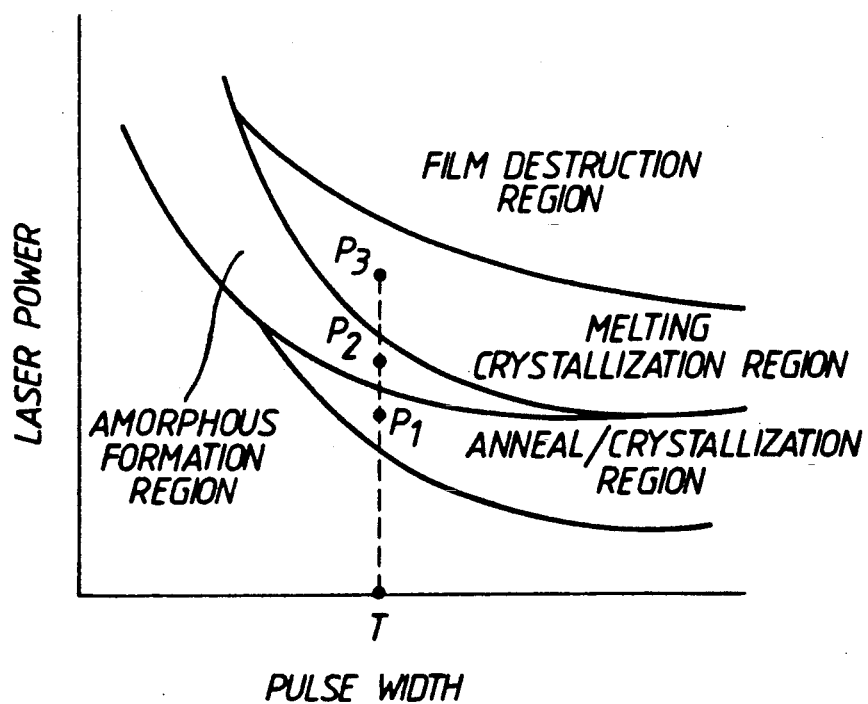
FIG. 5 is a graph of radiating conditions of a laser beam and states of a laser beam-radiated portion of a recording layer.

An example in which a phase-transformation type recording medium is employed will be described below. FIG. 5 shows the state of a beam-radiated portion of a recording layer corresponding to various power and pulse width settings of the recording laser beam. Referring to FIG. 5, when a laser beam having a pulse width T and power P1 is radiated on medium 200, radiated portion is crystallized upon annealing. When a laser beam having pulse width T and power P2 is radiated the beam-radiated portion becomes amorphous after melting. When a laser beam having pulse width T and power P3 is radiated, the beam-radiated portion is crystallized after melting. That is, if the power level of the radiated laser beam exceeds the level at which the recording medium becomes amorphous after melting, the radiated portion cannot be quickly cooled, and an amorphous state is difficult to obtain. If the power of the laser beam falls within the range at which melting/amorphous formation occurs, the degree of amorphous formation in the recording medium is increased with changes in the power of the laser beam, and variations in the optical characteristics, e.g., reflectivity and transmittance, of the record spot can be achieved.

The length of the recording mark in which melting-/amorphous region formation occurs is increased in proportion to the increase in radiating time of the laser beam onto the recording medium.

As described above, various states and lengths of the recording mark can be formed by converting data into signals having n levels and modulating the energy and radiating time of a laser beam in accordance with the signals. The radiated area (hereafter called the record spot) will be either an anneal-crystallization region, a melting/amorphous formation region, or a melting/-crystallization region.

If the intensity and pulse width of the laser beam are respectively set to be P and T, energy E of the laser beam can be given by $E = P \times T$. Therefore, in order to change the energy E, one or both of the intensity and pulse width of the laser beam may be changed. Note that as the energy of a radiated beam is changed, the record spot is changed. The recording operation will be described in greater detail by illustrating a recording operation using 6-bit data. In this example, the amorphous state of recording layer 23 is set to be an initial state. Crystallinity of the recording layer is taken into consideration first. Assume that the laser beam energy required for complete crystallization of a radiated portion is given as E5, and energies corresponding to intermediate levels are respectively given as E1 to E4 in increasing order of energy. When a laser beam having energy levels from E1 and E4 is radiated, different portions of the illuminated portions of the record medium are crystallized, and the remaining portions become amorphous; thus, intermediate states can be obtained in which crystalline and amophous phases are present at the same time. As the energy is increased from E1 to E4, the crystallinity of the radiated portion is increased.

The reflectivity is increased or decreased in accordance with changes in the crystallinity. Thus, it is possible to create regions with five different reflectivities. In this case, if the number of possible bits is selected to correspond to no laser beam energy, and a radiated laser beam having energies E1 to E5, 6-bit data can be recorded in a single record spot. For example, the reflectivity of a non-radiated portion is R0, and reflectivities corresponding to laser beam energies E1 to E5 are R1 to R5, respectively, a relationship as shown in the following Table 1 is established between laser beam energy, reflectivity, and the number of bits.

TABLE 1

| Laser beam energy | Reflectivity | Data bit |
|---|---|---|
| 0 | R0 | 0 |
| E1 | R1 | 1 |
| E2 | R2 | 2 |
| E3 | R3 | 3 |
| E4 | R4 | 4 |
| E5 | R5 | 5 |

Figure 6:
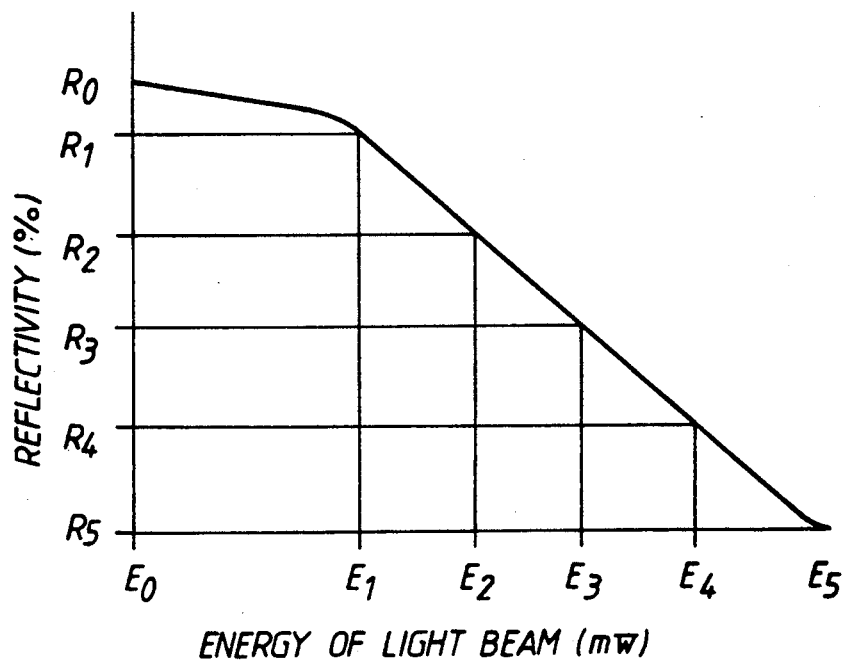
FIG. 6 is a graph showing the relation between the energy of a light beam and the reflectivity of the recording medium.

FIG. 6 shows the relationship between the energy of a laser beam and reflectivity given in Table 1.

Such multi-value recording can also be performed by changing the wavelength of a laser beam output from semiconductor laser 11 in a multi-level manner in accordance with the data signal. More specifically, in the present invention, the above-described semiconductor laser, an HeNe laser or the like, can be suitably used as a light source. The laser beam emitted from such a light source has an emission pattern based on the TEM00 fundamental mode, and its sectional intensity distribution exhibits a Gaussian distribution. When such a beam is converged by a lens, it can be converged only to a limited radius due to diffraction. If the minimum beam radius is D (beam waist), the following equation can be established:

$D = k\lambda/NA,$ where K is a constant(K=0.41), λ is the wavelegth of a light beam, and NA is the numerical aperture of a lens.

As is apparent from this equation, as the wavelength of a laser beam is decreased, the converged spot diameter is decreased. That is, when only the wavelength of the laser beam is changed, with the intensity and pulse width kept constant, the diameter of a beam-radiated portion can be changed according to the equation described above. In addition, since the spot size itself is changed, the reflectivity is changed.

REPRODUCTION

Since the reflectivity and transmittance of a record spot change in accordance with information recorded in the spot, data can be reproduced by radiating a reproducing laser beam (to be described later) and detecting the reflectivity or transmittance of the record spot.

Data reproduced by multi-value recording is converted into an electrical signal by optical-electric conversion element 12 in accordance with the reflectivity of a laser beam-radiated portion e.g., a record spot. This signal is then processed by reproducing signal processor 40. Data can also be reproduced by detecting transmissivity of the recording medium, instead of the reflectivity.

As shown in Table 2, a 1:1 correspondence may be established between values of reflectivity and data bits by detecting the reflectivity of a laser-radiated portion subjected to multi-value recording. In addition, an approximate value of each reflectivity may be set to correspond to each data bit, as shown in Table 1, or stepwise correspondence may be established, as shown in Table 3.

TABLE 2

| Reflectivity | Data bit |
|---|---|
| R0 | 0 |
| R1 | 1 |
| R2 | 2 |
| R3 | 3 |
| R4 | 4 |
| R5 | 5 |

TABLE 3

| Reflectivity | Data bit |
|---|---|
| −R0 | 0 |
| R0−R1 | 1 |
| R1−R2 | 2 |
| R2−R3 | 3 |
| R3−R4 | 4 |
| R4−R5 | 5 |

ERASURE

If the recording layer is a phase transformation type, phase transformation of the layer can be reversed under certain radiating conditions of a laser beam. In this embodiment, since part or all of a multi value-recorded portion is crystallized, a laser beam may be radiated on this portion and the radiated potion will be melted and then quickly cooled to cause phase transformation from a crystalline state to an amorphous state, thereby erasing the data stored therein and new information is recorded in said recording layer by said pulse beam.

EXAMPLE 1

Figure 7:
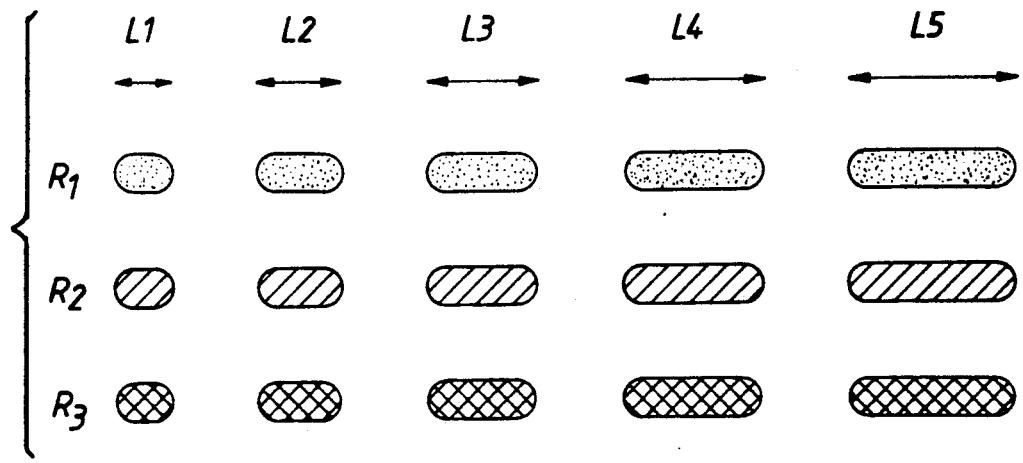
FIG. 7 is a view explaining the changes of reflectivity and lengths of the recording mark.

A phase-transformation type optical disk was used as the information recording medium. The optical disk was obtained by sequentially forming a 1000-A thick SiO protective layer, a 1000-A thick $(In_{48} Sb_{52})_{98} Te_2$ recording layer, a 1000-A thick SiO protective layer, and an ultraviolet-curing resin layer on a polycarbonate substrate. The recording layer exihibited an amorphous state as its initial state, and its phase transformation was caused upon radiation by a laser beam. Upon radiation of a laser beam having a power from W1 to W3, crystallization of the radiated portion progressed halfway, e.g. to an intermediate stage. The reflectivity of the radiated portion became respectivly R1 to R3. Radiation time was also modulated into L1 to L5 shown in FIG. 7. The relationship between reflectivity and radiation time and information bit is shown in Table 4.

TABLE 4

| | non radiated | R1 | R2 | R3 |
|---|---|---|---|---|
| non radiated | 0 | — | — | — |
| L1 | — | 1 | 2 | 3 |
| L2 | — | 4 | 5 | 6 |
| L3 | — | 7 | 8 | 9 |
| L4 | — | 10 | 11 | 12 |
| L5 | — | 13 | 14 | 15 |

Including the nonradiated portion, sixteen bits of information can be recorded in this example. Data recorded in this manner was reproduced as follows. A 0.5 mW continuous beam emitted from a semiconductor laser was radiated on the recording layer of a recording medium. A beam reflected by the recording layer was input to a processing circuit which output an analog signal having sixteen bits of information. Thus, in this example, it was proven possible to record a data bit having one of up to 16 different data at a single spot on the recording medium.

What is claimed is:

1. An apparatus for recording and reproducing multi-level information in an information recording medium, wherein said information recording medium comprises an information recording layer from which recorded information can be erased, comprising:

signal processing means for converting an information signal to be recorded into a processed signal having one of at least five possible signal levels;

light beam output means for outputting a light beam, a combination of whose energy and pulse width duration is modulated at multiple levels in accordance with said signal level; and optical means for directing said light beam onto said information recording medium to form a recording mark, whose state is modulated at multiple levels in accordance with the energy of said light beam and whose length is modulated at multiple levels in accordance with the pulse width duration of said light beam.

2. An apparatus according to claim 1, wherein said information recording medium comprises a recording layer in which not less than three states can be obtained in accordance with the energy of the light beam.

3. An apparatus according to claim 2, wherein said phases of said recording layer of said information recording medium comprise different phases of crystallinity obtained in accordance with the energy of the light beam.

4. An apparatus according to claim 1, wherein said light beam output means comprises a light source for emitting said light beam, said light source having a frequency which is modulated at multiple levels and whose energy varies in accordance with the frequency.

5. An apparatus according to claim 1, wherein said light beam output means comprises a light source for emitting a light beam obtained by superimposing a pulse beam whose energy is modulated at multiple levels onto a continuous light beam having constant energy, wherein information previously recorded in said recording layer is erased by the continuous light beam and new information is recorded in said recording layer by said pulse beam.

6. An apparatus according to claim 1, further comprising information reproducing means for reproducing multi-level information recorded in said information recording medium by detecting a difference in optical characteristics of said recording medium based on not less than three states of said information recording medium.

7. A method for recording and reproducing multi-level information in an information recording medium, wherein said information recording medium comprises an information recording layer from which recorded information can be erased, comprising the steps of:
- converting information to be recorded into a processed signal having one of at least five possible signal levels;
- outputting a light beam combination, of whose energy and pulse width duration are modulated at multiple levels in accordance with said signal level; and
- directing said light beam onto said information recording medium to form a recording mark whose state is modulated at multiple level in accordance with energy or said light beam and whose length is modulated at multiple levels in accordance with pulse duration of said light beam.

8. A method according to claim 7, wherein said information recording medium comprises a recording layer in which not less than three phases can be obtained in accordance with radiation energy of the light beam.

9. A method according to claim 7, wherein said information recording medium comprises a recording layer in which not less than three phases having different crystallinities can be obtained in accordance with the energy of light beam.

10. A method according to claim 7, wherein said light beam is modulated at multiple wavelengths and energies.

11. A method according to claim 7, wherein said light beam is formed by superposing a pulse beam whose energy is modulated at multiple levels on a continuous light beam, and new information is recorded in said recording layer by the pulse beam.

12. A method according to claim 7, further comprising the steps of reproducing the multi-level information recorded in said information recording medium by detecting a difference in optical characteristics based on not less than three states of said information recording medium.

* * * * *